United States Patent [19]

Kleeberg et al.

[11] Patent Number: 4,783,345
[45] Date of Patent: Nov. 8, 1988

[54] METHOD FOR THE MANUFACTURE OF PREPREGS AND THEIR USE

[75] Inventors: Wolfgang Kleeberg, Erlangen; Heinz Hacker, Nuremberg; Jürgen Huber, Erlangen; Dieter Wilhelm, Forchheim, all of Fed. Rep. of Germany

[73] Assignee: Siemens Aktiengesellschaft, Munich, Fed. Rep. of Germany

[21] Appl. No.: 132,404

[22] Filed: Dec. 14, 1987

[30] Foreign Application Priority Data

Dec. 15, 1986 [DE] Fed. Rep. of Germany ....... 3642778

[51] Int. Cl.$^4$ .............................................. B05D 5/12
[52] U.S. Cl. .................................. 427/96; 427/389.7; 427/245
[58] Field of Search ...................... 427/96, 389.7, 245; 264/137

[56] References Cited

U.S. PATENT DOCUMENTS

| | | | |
|---|---|---|---|
| 2,838,511 | 6/1953 | Kogon | 269/248 |
| 3,972,765 | 8/1976 | Kondo | 427/96 |
| 4,024,305 | 5/1977 | Alpaugh | 427/96 |
| 4,525,534 | 6/1985 | Rasshofer | 525/127 |
| 4,597,996 | 7/1986 | Chellis | 427/96 |
| 4,713,137 | 12/1987 | Sexton | 427/96 |

FOREIGN PATENT DOCUMENTS

3227219A1  2/1984  Fed. Rep. of Germany .

Primary Examiner—Shrive Beck
Assistant Examiner—Vi Duong Dang
Attorney, Agent, or Firm—Kenyon & Kenyon

[57] ABSTRACT

Prepregs can be prepared by impregnating reinforcement materials such as glass, carbon or plastic (in the form of fibers or nonwoven or woven materials) with a solution of a polyepoxy resin and a polyamine as a hardener and subsequent drying. For the manufacture of storage-stable prepregs based on polyepoxy resins, 1,3,5-tris(3-amino-4-alkylphenyl-2,4,6-trioxo-hexahydrotriazine with a $C_1$- to $C_4$ alkyl radical is used as the hardener. The new method leads to storage-stable prepregs and assures that composite materials, especially circuit boards, manufactured therefrom meet the requirements for these materials.

14 Claims, No Drawings

METHOD FOR THE MANUFACTURE OF PREPREGS AND THEIR USE

BACKGROUND OF THE INVENTION

The invention relates to a method for manufacturing prepregs by impregnating reinforcement materials of glass, carbon or plastic in the form of fibers, nonwoven or woven fabrics or of paper-like materials with a cellulose base with a polyepoxy resin.

Composite materials with a base of a cross-linked, organic-polymer resin matrix and reinforcement materials or embedment components in the form of fibers, nonwoven and woven fabrics of glass, carbon or organic-synthetic material such as aramides (i.e., aromatic polyamides) or of paper-like materials with a cellulose base are of increased importance in various branches of engineering because they allow in a simple manner the combination of various particularly advantageous properties to form an advanced overall property picture. Of decisive importance here are the properties of the matrix material. Thus, the matrix material should have features which allow safe, reproducible processing as well as the far reaching utilization of the properties of the reinforcement materials or the embedment components.

A first feature is a matrix component which permits the manufacture of prepregs with sufficiently stable properties for further processing and which can be stored. For this purpose it is important that the prepregs should avoid adhesive character; however, they also should not be hardened completely; the resin matrix should only be prepolymerized, i.e., it still should be meltable. Features of the cross-linked resin matrix include high boundary surface adhesion with the reinforcement materials and embedment components and optionally, also with other materials, for instance, metallic or ceramic materials which are to be joined to fiber- or textile-reinforced prepregs. In the cross-linked condition, high chemical stability, dimensional stability under heat and (for electrical-engineering application) also durable, high electric insulation properties are further important features.

Such properties of a cross-linked polymer matrix can be achieved if aromatic and/or heterocyclic polyepoxy resins, i.e., polyglycidyl compounds are used and as a cross-linking component, i.e., as a hardener, aromatic polyamines. Examples for such polyamines are 4,4' diaminodiphenyl methane and 4,4'-diaminodiphenyl sulfone (see, for instance, DE-OS No. 32 10 746) and polyamines such as are known from German Pat. No. 27 43 680. The last-mentioned polyamines lead to particularly thermally dimensionally stable, aging-stable and non-inflammable network polymers. However, it has also been found that it is very difficult to maintain safe and reproducible processing techniques with cross-linking components of the kind mentioned above.

It is an object of the invention to develop a method for the manufacture of prepregs based on polyepoxy resins in such a manner that the manufacture of storage-stable prepregs is possible. It is an object also to manufacture composite materials from the prepregs which exhibit properties required of these materials.

SUMMARY OF THE INVENTION

These and other objects are met by the method of the invention which is directed to the preparation of storage stable prepregs.

According to this method, a reinforcement material is impregnated with a solution of an aromatic and/or heterocyclic polyepoxy resin and an aromatic polyamine as a hardner in an organic solvent and subsequently dried at elevated temperature to produce the prepreg. The impregnating solution employed in the foregoing fashion contains an isocyanuric acid derivative, i.e., a 1,3,5-tris(3-amino-4-alkylphenyl)-2,4,6-trioxohexahydrotriazine with a $C_1$ to $C_4$ alkyl radical, as a hardener.

The invention also includes these prepregs manufactured in this manner and the use of these prepregs for the manufacture of composite materials, as well as composite materials which are composed at least partly of such prepregs, i.e., composite materials which contain prepregs according to the invention as well as other prepregs. Such composite materials are preferrably produced by pressing at elevated pressure and elevated temperature.

DETAILED DESCRIPTION OF THE INVENTION

The prepregs according to the invention can be produced cost-effectively. The polyepoxy resin and the hardener are processed in the form of solutions in customary impregnation plants. Inexpensive solvents such as acetone, ethylacetate, methylethyl ketone and methylglycol (2-methoxyethanol) can be used. The impregnated reinforcement materials or embedment components are then dried at elevated temperature, during which the solvent is removed and prepolymerization of the polyepoxy resin takes place. In this manner, an extraordinarily advantageous ratio of costs to attainable properties is obtained overall.

According to the method of the invention, prepregs can be manufactured which are nonadhesive and are storage-stable at room temperature for a duration of six weeks and more, i.e., have sufficient storage stability. In addition, these prepregs can be processed into composite materials which are distinguished by a high glass transition temperature ($T_g$ more than 200° C.) and low combustibility. If, for instance, a glass fabric with a mass content of 60 to 62% is used as the embedment material, the composite materials according to the invention have self-extinguishing properties without the addition of nucleus-halogenated components, due to the partially heterocyclic structure in the hardened resin system. Measurements on test specimens according to test procedure IEC 249-1 show an average burning time of 5 seconds so that flame-retarding additives are not necessary for qualification under this standard. The composite materials have the further advantage that they form no corrosive or particularly toxic decomposition products in the case of thermal overloading.

The hardened composite materials are further distinguished by a high mechanical-thermal property level and a thermal coefficient of expansion which is small and constant over a wide temperature range. They are therefore suitable for highly stressed structural materials and in particular also as materials for manufacturing one and two-sided copper-clad printed circuit boards and for manufacturing multi-layer circuits if prepregs according to the invention are used. Of particular advantage for the use as circuitboard material is the high adhesion of strip conductors of copper, the high delamination resistance and excellent machinability which manifests itself, for instance, in the drilling of through-plating holes by the feature that perfect drill holes with little drill wear are obtained. Thereby, double- and multi-layer circuit boards can be manufactured with the materials according to the invention more safely and inexpensively than with materials which represent the present state of the art: with the FR-4 materials presently used on a large scale in circuit board technology, drill holes for the subsequent electrically conducting connection of the copper layers must be etched free afterwards; with circuit board materials with a polyamide base, greater drill wear must be expected in addition to a higher material price and a more expensive processing technique in the manufacture of circuit boards.

The compounds used as hardeners in the method according to the invention are primary polyamines having aromatic amino groups. Such polyamines can be prepared, for instance, by hydrolysis of suitable compounds with free isocyanate groups. Such a method is known, for instance, from DE-OS No. 32 27 219. The polyamines prepared in accordance with the known method serve for the manufacture of polyurethanes, polyurethane plastics and polyurethane foam materials. While one among several further possible applications of the polyamines is given in DE-OS No. 32 27 219 as "hardener for epoxy and phenolic resins", it is entirely surprising and could in no way be foreseen that from the large number of compounds cited there, just one polyamine type, namely 1,3,5-tris(3-amino-4-alkylphenyl)-2,4,6-trioxo-hexahydrotriazine, couls be used for the preparation of such prepregs based on polyepoxy resins which are stable in storage and provide in the further processing composite materials with a high property level.

The hardener used with the method according to the invention is prepared from 2,4-diisocyanate alkyl benzenes such as 2,4-diisocyanate toluene. The diisocyanate alkyl benezenes (alkyl=$CH_3, C_2H_5, C_3H_7$ or $C_4H_9$) are trimerized b suitable catalysts and converted into 1,3,5-tris(3-isocyanato-4-alkylphenyl)-2,4,6-trioxo-hexahydrotriazines. The polyamines are then formed therefrom by hydrolysis of the isocyanate groups.

If unconverted starting material, i.e., monomeric diisocyanato-alkylbenzene is present in the reaction mixture obtained in the trimerization, aromatic polyamines are formed in the hydrolysis as byproducts. Such polyamines can be used in the method according to the invention as an additive hardener component, besides the hardener proper.

In the hydrolysis of the trimerization product containing isocyanate groups, a reaction between isocyanate groups and amino groups can also come about. Heterocyclic polyamines with urea groupings are obtained hereby as a byproduct of the hydrolysis reaction. In the method according to the invention, such polyamines can likewise be used as an additive hardener component, i.e., in a mixture with the hardener proper.

In the method according to the invention, hydrolysis products of trimerized diisocyanato-alkyl benzenes are thus used preferentially as hardeners, i.e., hardener mixtures. In hardener mixtures of this kind, the content of the hardener proper, i.e., 1,3,5-tris(3-amino-4-alkyl phenyl)-2,4,6-trioxohexahydrotriazine in the mixture is advantageously at least 50% by weight and preferably between 80 and 95% by weight. The ratio between the epoxy function employed and the amine hydrogen function (NH) employed is otherwise advantageously 0.9:1 to 1.1:1 and preferably about 1:1 in the method according to the invention.

Besides the hardener proper or besides hardener mixtures of the kind mentioned above, also aromatic polyamines of a different kind can be used in the method according to the invention such as 4,4'-diaminodiphenylmethane and 4,4'-diaminodiphenylsulfone, and/or other heterocyclic polyamines. The content of such polyamines in the hardener mixture is maximally 5% by weight.

Suitable polyepoxides, i.e., polyglycidyl compounds, are, for instance: epoxidized novolaks, polyglycidyl ethers with a bisphenol A-, bisphenol F- or bisphenol B base as such or in nucleus brominated form, as well as epoxidized hydantoins and triglycidylisocyanurate; the epoxides can also be present in a mixture. Preferably is used s the polyepoxy resin an epoxidized novolak with an epoxy number of 0.3 to 0.6 and a total content of hydrolyzable halogen of less than 0.6% by weight and preferably less than 0.1% by weight. Advantageously, the epoxidized novolak can be used together with triglycidyl isocyanurate or together with a nucleushalogenized bisphenol-bisglycidyl ether, or an epoxidized nucleus-halogenated novolak, where the total content of nucleus-bound halogen of the mixture is less than or equal to 4% by weight.

As already explained, paper-like materials with a cellulose base or reinforcement materials of glass, carbon or plastic, i.e. of organic-synthetic material such as highly heat resistant high-module fibers, for instance, with an aramide or a polyphenylene sulfide basis, in the form of woven or nonwoven fabrics serve as embedment components. If reinforcement materials of the type mentioned are used, prepregs for mechanically highly stressed structural materials are obtained. These structural materials are suitable, for instance, for application in machine design in vehicle design, in aeronautics and in electrical engineering, especially in the form of prepregs for circuit board technology.

The invention will be explained in further detail with reference to embodiment examples.

EXAMPLE 1

Preparation of 1,3,5-tris(3-isocyanato-4-methylphenyl)-2,4,6-trioxo-hexahydrotriazine 500 g 2,4-diisocyanatotoluene (NCO content: 48.2%) are trimerized (see in this connection U.S. Pat. No. 2,801,244) under catalytic conditions with sodium benzoate dissolved in dimethylformamide. After about 1 hour, the reaction is stopped at an NCO value of 24.8% by the addition of p-toluenesulfonic acid.

EXAMPLE 2

Preparation of 1,3,5-tris(3-amino-4-methylphenyl)-2,4,6-trioxohexahydrotriazine

The hydrolysis of isocyanate compounds to form the corresponding amines is described in the literature. Examples for the hydrolysis by means of basic and acid catalysts can be found in French Pat. No. 14 15 317, DE-AS No. 11 55 907; DE-OS No. 29 48 419; DE-OS No. 30 39 600; DE-OS No. 31 12 118; DE-OS No. 32 44 912 and DE-OS No. 32 44 913. Another possibility of amine synthesis is based on the thermal decomposition of addition products of isocyanates and alcohol such as is described, for instance, in DE-AS No. 12 70 046 and DE-OS No. 30 35 639. The hydrolysis of isocyanate compounds proceeds particularly advantageously with concentrated sulfuric acid (according to German Pat. No. 27 43 680) or in high-boiling solvents (according to DE-OS No. 32 27 219).

In the hydrolysis of 1,3,5-tris(3-isocyanato-4-methylphenyl)-2,4,6-trioxo-hexahydrotriazine according to De-OS No. 32 27 219, a solution of the trimerisate prepared according to Example 1, in dimethylacetamide is added to a hot mixture of dimethylacetamide, water and Florisil as a catalyst (Florisil ®, a product of Floridin Corporation, consists essentially of magnesium silicate). After processing, a mixture of 1,3,5-tris(3-amino-4-methylphenyl)-2,4,6-trioxohexahydrotriazine and heterocyclic polyamines with an $NH_2$ content of 7.9% by weight is obtained.

EXAMPLE 3

Preparation of Prepregs 3000 parts by weight of an epoxidized novolak with an epoxy value of 0.57 are dissolved in 1600 parts by weight of a 1:1 mixture of acetone and methylglycol. To this solution, a solution of 1730 parts by weight of the hardener mixture prepared in accordance with Example 2 ($NH_2$ content: 7.9% by weight) in 1000 parts by weight of a 1:1 mixture of acetone and methylglycol is added. With the 65% solution obtained in this way, a glass fabric (linen binding, basis weight:197 g/m$^2$) is impregnated. After the impregnation, the solvent is removed in a drier 10 m long at temperatures of 80° to 150° C. (drawing-off velocity : 2m/min). Prepregs prepared in this manner are nonadhesive and are storage-stable for more than 6 weeks at room temperature.

EXAMPLE 4

Preparation of Composite Materials

From the prepregs prepared in accordance with Example 3, composite materials in the form of double-and multi-layer circuit boards are made. The processing is done in platen presses at a temperature of 170° C. and a pressure of 70 bar. An examination of the circuit board material obtained in this manner with respect to the electrical and mechanical/thermal properties as well as with respect to machinability yields excellent results.

In detail, these are:
glass transition temperature $T_g$:
  without annealing 203° C.
  annealed 2 hrs. at 190° C.: 225° C.
  annealed 2 hrs. at 210° C.: 243° C.
adhesion of an 18 micron copper foil at room temperature: 1.4 N/mm
layer bonding: no delamination in the ball test
solder bath test: passed, 270° C./20 s
surface resistance: $1.2 \times 10^{14}$ ohm
tan δ (room temperature, 50 Hz): $10 \times 10^{-3}$
εr (room temperature, 50 Hz): 5.15
mean burning time as per IEC 249-1: 5 s
cutting ability with test cut according to DIN 53 488: passed
drilling ability: after 2204 drilling operations no unusual wear of the drill bits; no etching of the holes is necessary.

Composite materials for circuit boards according to the invention can thus be processed overall more efficiently than materials of quality FR4 which are furthermore less dimensionally stable under heat. The glass transition temperature of the composite materials according to the invention (Tg: 220° to 250° C.) almost reaches the level of polyimide materials (Tg: 250 to 260° C.), of which the production, the processing, the machinability and the material are substantially more expensive. The adhesion of an 18- micron copper foil (at room temperature) is 1.2 to 1.4 N/mm for FR-4 material and 1.0 to 1.2 N/mm for polyimide material as compared with the value of 1.4 N/mm with the composite materials according to the invention. Besides the improved thermomechanical properties and an inherent property of being hardly combustible, the composite materials according to the invention are further characterized as compared with FR-4 materials (with a content of 17 to 18 percent by weight bromium radical) by the feature that they reach, with a halogen addition of maximally up to 4%, the same burning behavior as FR.materials and thereby lead in the event of thermal overload to distinctly reduced secondary damage by splitting off gaseous decomposition products.

We claim:

1. A method for the manufacture of prepregs, comprising: impregnating a reinforcement material with a solution of an aromatic and/or heterocyclic polyepoxy resin and an aromatic polyamine as hardener in an organic solvent and subsequently drying at elevated temperature, the hardener being 1,3,5-tris(3-amino-4-alkylphenyl)-2,4,6-trioxohexahydrotriazine having 1 to 4 carbon atoms in the alkyl radical.

2. A method according to claim 1, wherein the 1,3,5-tris(3-amino-4-alkylphenyl)-2,4,6-trioxohexahydrotriazine is mixed with additional aromatic and/or heterocyclic polyamines.

3. A method according to claim 2, wherein the content of 1,3,5-tris(3-amino-4-alkylphenyl)-2,4,6-trioxohexahydrotriazine in the hardener mixture is at least 50% by weight.

4. A method according to claim 3 wherein the content of hardener is from about 80 to about 95 percent by weight.

5. A method according to claim 1 wherein the ratio of epoxy groups to amine hydrogen is from about 0.9:1 to about 1.1:1.

6. A method according to claim 5 wherein the ratio is about 1:1.

7. A method according to claim 1 wherein an epoxidized novolak with an epoxy number of 0.3 to 0.6 and a total content of hydrolyzable halogen of less than 0.6 percent by weight, and preferably less than 0.1 percent by weight, is used as the polyepoxy resin.

8. A method according to claim 7, wherein the epoxidized novolak is used together with triglycidylisocyanurate.

9. Method according to claim 7, wherein the epoxidized novolak is used together with a nucleus-halogenated bisphenol-bisglycidyl ether and/or a nucleus-halogenated epoxidized novolak, the total content of nucleus-bound halogen being less than or equal to 4 percent by weight.

10. A prepreg prepared by the method of claim 1.

11. A method for use of a prepeg according to claim 10, comprising combining the prepreg with a conducting layer to form a composite material.

12. A method according to claim 11 wherein the composite material is a double- or multi-layer printed circuit board for electrical engineering.

13. A composite material manufactured at least partially from prepregs according to claim 10.

14. A method according to claim 1 wherein the reinforcement material is glass, carbon or plastic formed into fiber, woven or nonwoven material or a paper-like material based upon cellulose

* * * * *